United States Patent
Takabe et al.

(10) Patent No.: US 12,251,936 B2
(45) Date of Patent: Mar. 18, 2025

(54) MEMS DEVICE, LIQUID EJECTING HEAD, AND LIQUID EJECTING APPARATUS

(71) Applicant: SEIKO EPSON CORPORATION, Tokyo (JP)

(72) Inventors: Motoki Takabe, Shiojiri (JP); Yu Shiozawa, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 143 days.

(21) Appl. No.: 18/098,157

(22) Filed: Jan. 18, 2023

(65) Prior Publication Data
US 2023/0226818 A1 Jul. 20, 2023

(30) Foreign Application Priority Data

Jan. 19, 2022 (JP) ................................ 2022-006110

(51) Int. Cl.
*B41J 2/14* (2006.01)
*B41J 2/16* (2006.01)
*B81B 7/02* (2006.01)

(52) U.S. Cl.
CPC ......... *B41J 2/14233* (2013.01); *B41J 2/1606* (2013.01); *B41J 2002/14306* (2013.01); *B41J 2002/14362* (2013.01); *B41J 2002/14419* (2013.01); *B41J 2002/14475* (2013.01); *B41J 2002/14491* (2013.01); *B41J 2/162* (2013.01); *B41J 2/1623* (2013.01); *B41J 2/1628* (2013.01); *B41J 2/1629* (2013.01); *B41J 2/164* (2013.01); *B41J 2202/08* (2013.01); *B81B 7/02* (2013.01); *B81B 2201/052* (2013.01)

(58) Field of Classification Search
CPC .......... B41J 2/14233; B41J 2002/14306; B41J 2002/14419; B41J 2/162; B41J 2/164; B41J 2002/14362; B41J 2202/08; B41J 2/1606; B41J 2002/14475; B41J 2/1623; B41J 2002/14491; B41J 2/1628; B41J 2/1629; B81B 7/02; B81B 2201/052
See application file for complete search history.

(56) References Cited

FOREIGN PATENT DOCUMENTS

| JP | 2014-124887 A | 7/2014 | |
| JP | 2015-036202 A | 2/2015 | |
| JP | 2015036202 | * 2/2015 | .............. B41J 2/161 |

* cited by examiner

*Primary Examiner* — Henok D Legesse
(74) *Attorney, Agent, or Firm* — Harness, Dickey & Pierce, P.L.C.

(57) ABSTRACT

A MEMS device includes a first substrate 22 including a single-crystal silicon substrate and a second substrate 23 including a single-crystal silicon substrate, in which the first substrate 22 and the second substrate 23 are laminated together, and the first substrate 22 and the second substrate 23 are joined to each other such that the cleavage directions of both substrates intersect each other.

14 Claims, 10 Drawing Sheets

MEMS DEVICE, LIQUID EJECTING HEAD, AND LIQUID EJECTING APPARATUS

The present application is based on, and claims priority from JP Application Serial Number 2022-006110, filed Jan. 19, 2022, the disclosure of which is hereby incorporated by reference herein in its entirety.

BACKGROUND

1. Technical Field

The present disclosure relates to a MEMS device, a liquid ejecting head, and a liquid ejecting apparatus.

2. Related Art

An example of a micro electro mechanical systems (MEMS) device includes a liquid ejecting head, such as an ink jet recording head. An ink jet recording head includes a flow path forming substrate having a pressure chamber in communication with nozzles from which liquid droplets are ejected and a pressure generating element, such as a piezoelectric element, provided on one surface of the flow path forming substrate, and the ink jet recording head ejects liquid droplets from the nozzles by causing pressure changes in the liquid within the pressure generating chamber by driving the pressure generating element.

The ink jet recording head may have various structures. In one structure, for example, the flow path member having an ink flow path which includes the pressure chamber and the nozzles and through which ink circulates is formed of a plurality of laminated substrates. In another structure, for example, the flow path member includes a plurality of laminated single-crystal silicon substrates. For example, each of the flow path forming substrate in which the pressure chamber and the like are formed, the nozzle plate in which nozzle openings are formed, and the nozzle communication path through which the pressure chamber is in communication with the nozzle openings is formed of a single-crystal silicon substrate. See, for example, JP-A-2014-124887. The flow path forming substrate, the nozzle plate, and the communication plate are substrates in which the ink flow path is formed and correspond to the flow path member.

When the flow path member includes a plurality of laminated single-crystal silicon substrates as described in JP-A-2014-124887, the ink flow paths can be advantageously formed in relatively high density with relatively high precision. On the other hand, a single-crystal silicon substrate also has a disadvantage of being more likely to crack.

For example, a single-crystal silicon substrate is more likely to crack due to impact, bending deformation caused by temperature changes, and the like. When the thickness is relatively small, cracks are particularly likely to occur. Since, for example, the thickness of the nozzle plate is relatively small, cracks are likely to occur when the nozzle plate is formed of a single-crystal silicon substrate, and cracks may occur even if, for example, a non-recording medium, such as a recording sheet, comes into contact with the nozzle plate.

It should be noted that such a problem occurs not only in the liquid ejecting head, which ejects liquid, such as ink, but also in MEMS devices other than the liquid ejecting head.

SUMMARY

According to an aspect of the present disclosure, there is provided a MEMS device including: a first substrate including a single-crystal silicon substrate; and a second substrate including a single-crystal silicon substrate, the first substrate and the second substrate being laminated together, in which the first substrate and the second substrate are joined such that a cleavage direction of the first substrate intersects a cleavage direction of the second substrate.

According to another aspect of the present disclosure, there is provided a liquid ejecting head including: a flow path member in which a liquid flow path including a pressure chamber is formed; and a pressure generating element provided on one side of the pressure chamber, the pressure generating element causing a pressure change in the pressure chamber via a diaphragm, the liquid ejecting head ejecting a liquid from a nozzle in communication with the pressure chamber to an ejection target medium, in which the flow path member includes a first substrate including a single-crystal silicon substrate and a second substrate including a single-crystal silicon substrate, and the first substrate and the second substrate are provided on a side of the pressure chamber across the diaphragm, and the first substrate and the second substrate are joined to each other such that a cleavage direction of the first substrate intersects a cleavage direction of the second substrate.

Another aspect of the present disclosure is a liquid ejecting apparatus having the liquid ejecting head according to the aspect described above.

DESCRIPTION OF EXEMPLARY EMBODIMENTS

The present disclosure will be described in detail below based on embodiments. However, the following description pertains to one aspect of the present disclosure, and the structure of the present disclosure can be arbitrarily changed within the scope of the disclosure. In the drawings, the same members are denoted by the same reference numerals to omit duplicate descriptions.

In the drawings, X, Y, and Z represent three spatial axes orthogonal to each other. Herein, the directions of these axes are referred to as the X direction, the Y direction, and the Z direction. The directions of the arrows in the drawings are the positive (+) directions, and the directions opposite to the arrows are the negative (−) directions. In addition, the Z direction indicates a vertical direction, the +Z direction indicates a vertically downward direction, and the −Z direction indicates a vertically upward direction. Furthermore, the three X-, Y-, and Z-spatial axes for which positive and negative directions are not limited will be described as the X-axis, the Y-axis, and the Z-axis.

First Embodiment

Figure 1:
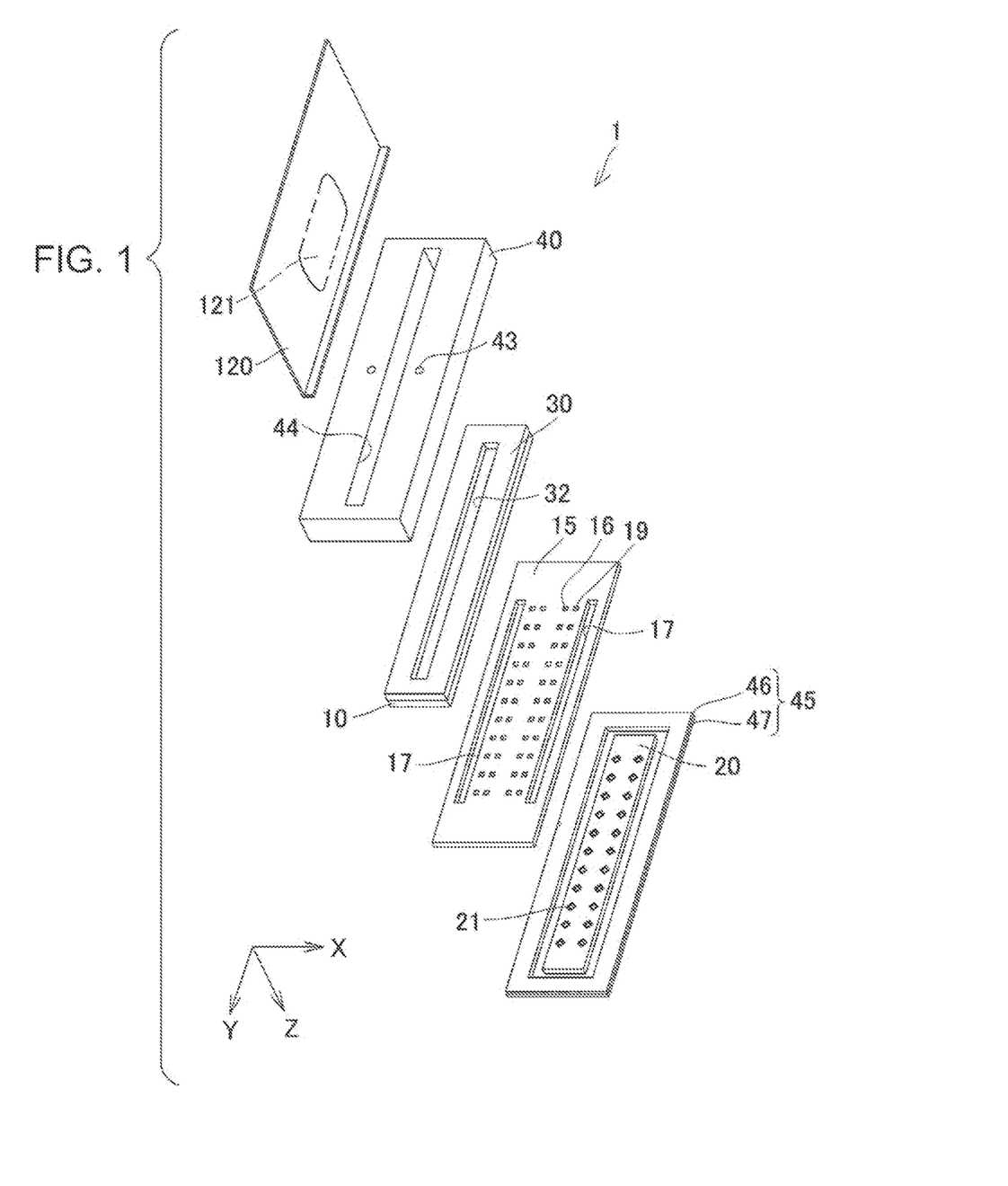
FIG. 1 is an exploded perspective view of an ink jet recording head according to a first embodiment.
Figure 2:
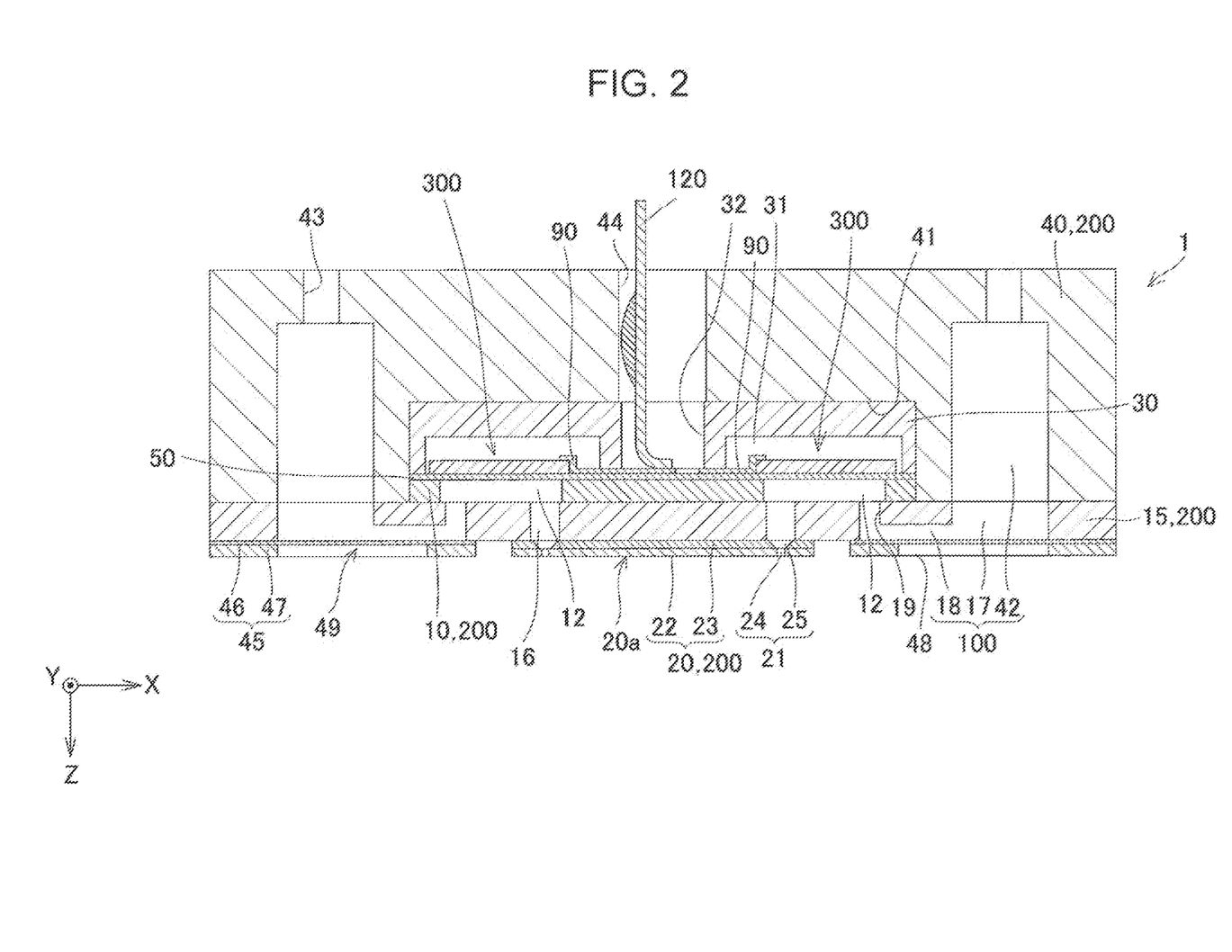
FIG. 2 is a sectional view of the ink jet recording head according to the first embodiment.
Figure 3:
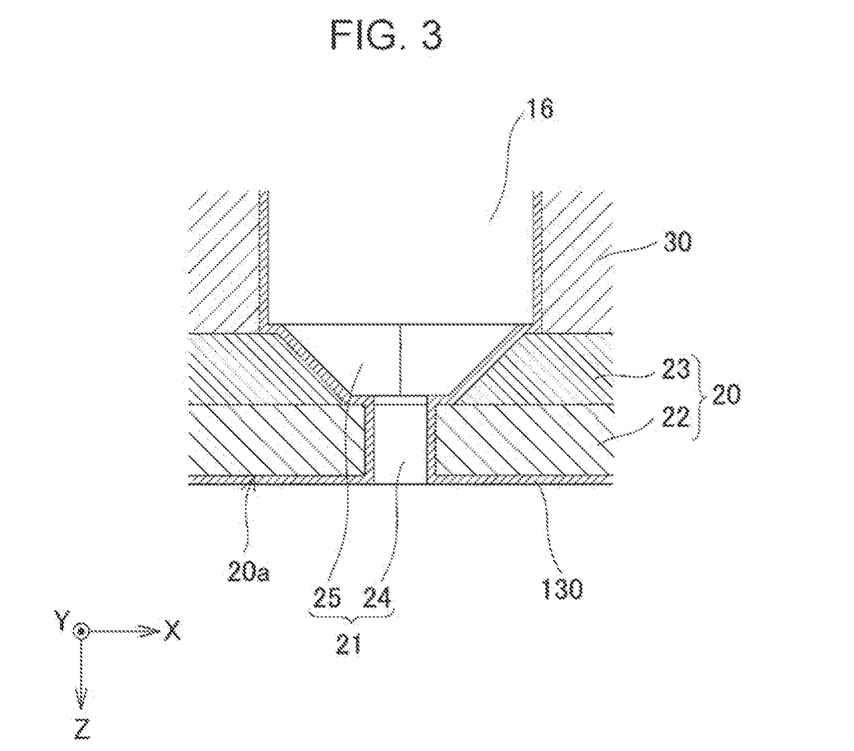
FIG. 3 is an enlarged sectional view of the ink jet recording head according to the first embodiment.
Figure 4:
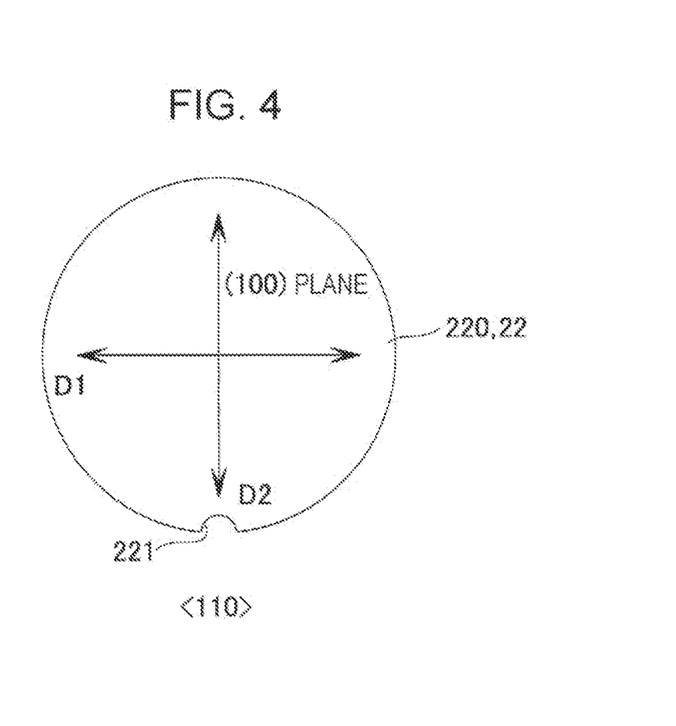
FIG. 4 is a diagram for describing a cleavage direction of a first silicon wafer.
Figure 5:
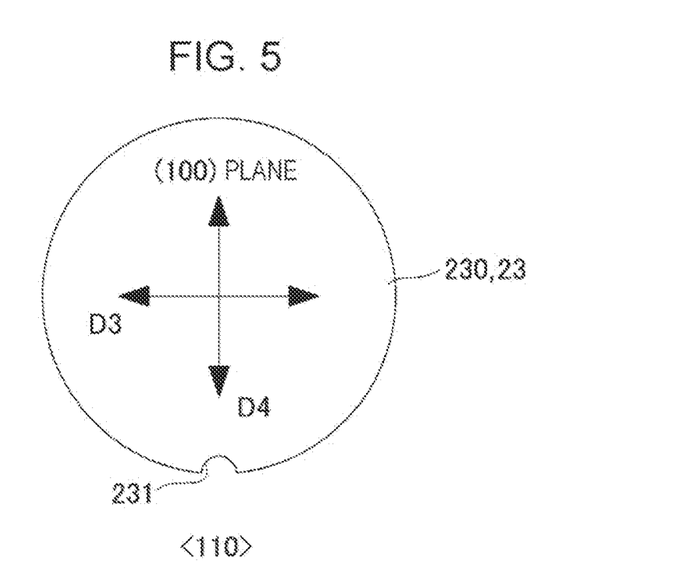
FIG. 5 is a diagram for describing a cleavage direction of a second silicon wafer.
Figure 6:
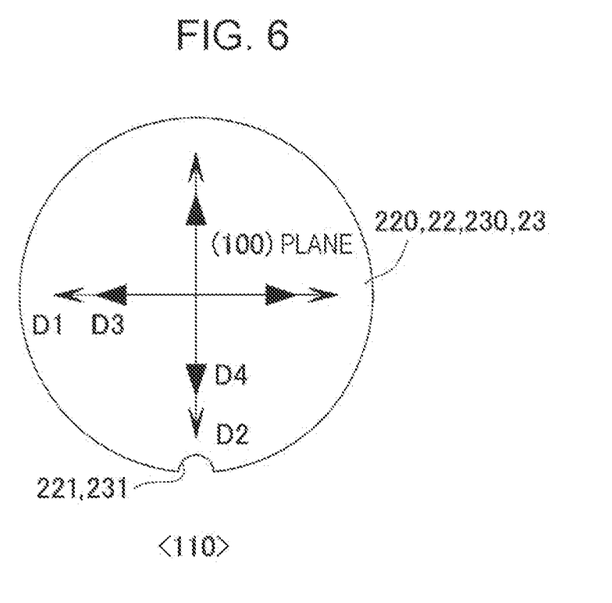
FIG. 6 is a diagram for describing a method of joining the first silicon wafer and the second silicon wafer to each other.
Figure 7:
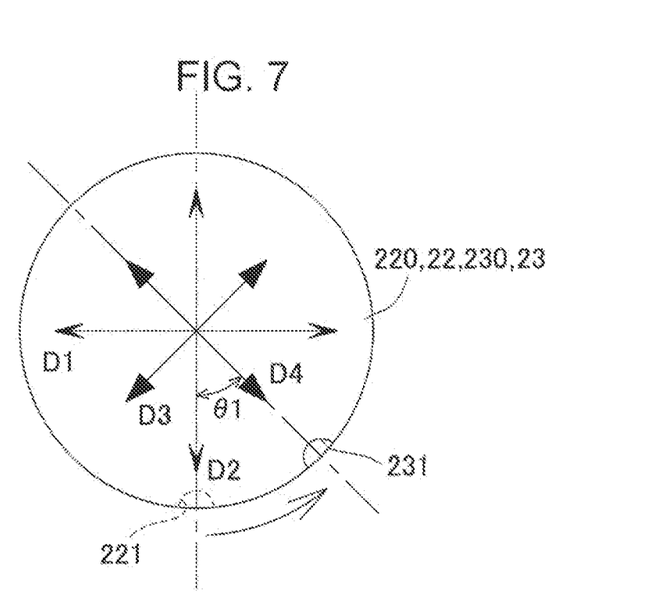
FIG. 7 is a diagram for describing the method of joining the first silicon wafer and the second silicon wafer to each other.
Figure 8:
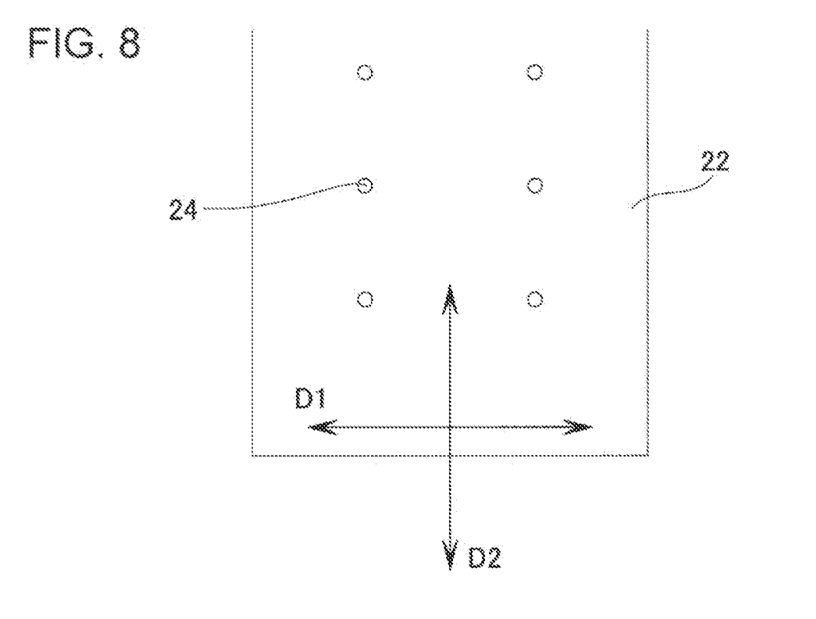
FIG. 8 is a diagram for describing the relationship between the cleavage direction and the parallel arrangement direction of first nozzle portions.
Figure 9:
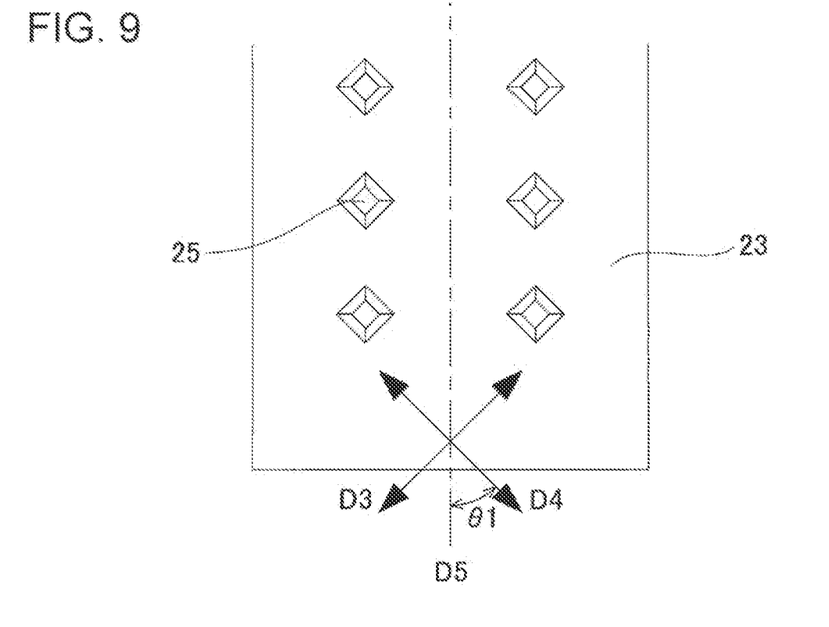
FIG. 9 is a diagram for describing the relationship between the cleavage direction and the parallel arrangement direction of second nozzle portions.

FIG. 1 is an exploded perspective view of an ink jet recording head, which is an example of a liquid ejecting head according to a first embodiment of the present disclosure. FIG. 2 is a sectional view illustrating the ink jet recording head taken in the X-axis direction. In addition, FIG. 3 is an enlarged sectional view of the vicinity of a nozzle of the ink jet recording head. In addition, FIGS. 4 and 5 are diagrams for describing the cleavage direction, FIG. 4 is a plan view of a first silicon wafer, and FIG. 5 is a plan view of a second silicon wafer. In addition, FIGS. 6 and 7 are diagrams for describing the procedure of joining the first silicon wafer and the second silicon wafer to each other. In addition, FIG. 8 is a diagram for describing the relationship between the cleavage direction and the parallel arrangement direction of the first nozzle portions, and FIG. 9 is a diagram for describing the relationship between the cleavage direction and the parallel arrangement direction of the second nozzle portions.

As illustrated, an ink jet recording head, which is also referred to below as a recording head 1, as an example of the liquid ejecting head according to the embodiment, ejects ink droplets in the Z-axis direction, more specifically, in the +Z direction.

The ink jet recording head 1 has a flow path member 200 that is formed by laminating a plurality of substrates and has an ink flow path as the liquid flow path through which ink as a liquid circulates. This flow path member 200 includes a plurality of laminated single-crystal silicon substrates, and a flow path forming substrate 10, a communication plate 15, and a nozzle plate 20 each include a single-crystal silicon substrate. It should be noted that not all of the laminated substrates of the flow path member 200 have to be single-crystal silicon substrates; only some of the laminated substrates need to be single-crystal silicon substrates.

In the flow path forming substrate 10, a plurality of pressure chambers 12 that constitute the ink flow path are disposed in two rows in the X-axis direction, which intersects the Z-axis direction. That is, the plurality of pressure chambers 12 that form the rows are disposed in the Y-axis direction, which intersects the X-axis direction.

The plurality of pressure chambers 12 constituting the columns are disposed on straight lines in the Y-axis direction such that the positions in the X-axis direction are the same. The pressure chambers 12 adjacent to each other in the Y-axis direction are partitioned by partition walls. The disposition of the pressure chambers 12 is not particularly limited. For example, the plurality of pressure chambers 12 arranged in the Y-axis direction may be staggered such that every other one of the pressure chambers 12 is shifted in the X-axis direction.

The communication plate 15 and the nozzle plate 20 are sequentially laminated together in the +Z direction of the flow path forming substrate 10.

The communication plate 15 is provided with nozzle communication paths 16 that enable the pressure chambers 12 to be in communication with nozzles 21 formed in the nozzle plate 20. In addition, the communication plate 15 is also provided with first manifold portions 17 and second manifold portions 18 that constitute some portions of manifolds 100 that serve as a common liquid chamber in which the plurality of pressure chambers 12 are in communication with each other. The first manifold portions 17 are provided so as to pass through the communication plate 15 in the Z-axis direction. The second manifold portions 18 are provided so as to open in a surface in the +Z direction without passing through the communication plate 15 in the Z-axis direction.

Furthermore, in the communication plate 15, supply communication paths 19 that are in communication with portions of one end of the pressure chambers 12 in the X-axis direction are provided for the pressure chambers 12, respectively. The supply communication paths 19 enable the second manifold portions 18 and the pressure chambers 12 to be in communication with each other and supply the ink in the manifolds 100 to the pressure chambers 12.

The material of the flow path forming substrate 10 and the communication plate 15 is not limited, and, for example, a silicon substrate, a glass substrate, an SOI substrate, and various ceramic substrates may be used. Alternatively, a metal substrate or the like may also be used as the communication plate 15. This metal substrate may be, for example, a stainless-steel substrate.

In the embodiment, a single-crystal silicon substrate having a surface orientation of {110} is used as the material of the flow path forming substrate 10 and the communication plate 15. The single-crystal silicon substrate used as the flow path forming substrate 10 and the communication plate 15 is not limited to a single-crystal silicon substrate having a surface orientation of {110} and may be a single-crystal silicon substrate having a surface orientation of {100}.

Here, the single-crystal silicon substrate having a surface orientation of {110} includes not only a single-crystal silicon substrate having a surface orientation of (110), but also, for example, single-crystal silicon substrates having surface orientations of (101), (011), (−110), (−101), and (0-11). That is, the single-crystal silicon substrate having a surface orientation of {110} includes single-crystal silicon substrates having surface orientations that are equivalent to (110). Similarly, the single-crystal silicon substrate having a surface orientation of {100} includes single-crystal silicon substrates having surface orientations that are equivalent to (100).

It should be noted that the flow path forming substrate 10 and the communication plate 15 may include materials having substantially the same thermal expansion coefficient. This can suppress warping of the flow path forming substrate 10 and the communication plate 15 due to differences between the thermal expansion coefficients when the temperatures of the flow path forming substrate 10 and the communication plate 15 change.

The nozzle plate 20 is provided on the surface on the side opposite to the flow path forming substrate 10 across the communication plate 15, that is, on the surface on the +Z direction side. The nozzle plate 20 has the plurality of nozzles 21 that are in communication with the pressure chambers 12 via the nozzle communication paths 16 formed in the communication plate 15.

In the embodiment, the nozzle plate 20 has the plurality of nozzles 21 disposed linearly in the Y-axis direction to correspond to the disposition of the pressure chambers 12. In addition, the nozzle plate 20 has two nozzle columns including the plurality of nozzles 21 in the X-axis direction. That is, the plurality of nozzles 21 in the columns are disposed to have the same positions in the X-axis direction in relation to the positions of the pressure chambers 12. It should be noted that the disposition of the nozzles 21 in relation to the pressure chambers 12 is not particularly limited. For example, every other one of the nozzles 21 disposed in parallel in the Y-axis direction may be shifted in the X-axis direction to correspond to the disposition of the pressure chambers 12.

Here, the nozzle plate 20 according to the embodiment is formed of two single-crystal silicon substrates. That is, as illustrated in the enlarged views in FIGS. 2 and 3, the nozzle plate 20 is formed by laminating the first nozzle forming substrate 22 corresponding to the first substrate and the second nozzle forming substrate 23 corresponding to the second substrate together in the Z-axis direction. The first nozzle forming substrate 22 forms a liquid ejected surface 20*a* onto which liquid ink is ejected, and the second nozzle forming substrate 23 is joined to the −Z direction side of this first nozzle forming substrate 22 by, for example, an adhesive or the like.

The first nozzle forming substrate 22 and the second nozzle forming substrate 23 include single-crystal silicon substrates having a single surface orientation. Specifically, the first nozzle forming substrate 22 and the second nozzle forming substrate 23 are formed of single-crystal silicon substrates having a surface orientation of {100}.

In addition, each of the nozzles 21 is formed by a first nozzle portion 24 that opens in the liquid ejected surface 20*a*, and a second nozzle portion 25 is provided on the −Z direction side of the first nozzle portion 24 and has a diameter larger than that of the first nozzle portion 24. The first nozzle portions 24 are provided to pass through the first nozzle forming substrate 22 in the Z-axis direction, and the second nozzle portions 25 are provided to pass through the second nozzle forming substrate 23 in the Z-axis direction.

In the embodiment, shapes of the first nozzle portions 24 and the second nozzle portions 25 are not particularly limited, and the first nozzle portions 24 are formed to be straight. The first nozzle portions 24 are formed by, for example, dry etching the first nozzle forming substrate 22 including a single-crystal silicon substrate having a surface orientation of {100}, and the inner diameter of the first nozzle portions 24 is substantially constant in the Z-axis direction.

In contrast, the second nozzle portion 25 is tapered such that the inner diameter thereof decreases toward the first nozzle portion 24. This second nozzle portion 25 is formed by, for example, anisotropically wet etching the second nozzle forming substrate 23 including a single-crystal silicon substrate having a surface orientation of {100}.

Accordingly, the opening shape of the second nozzle portion 25 is, for example, a rectangle such as a rhombus, and the second nozzle portion 25 includes four inner wall surfaces formed of inclined surfaces that are inclined with respect to the surface of the nozzle plate 20. That is, the inner wall surfaces of the second nozzle portion 25 are the inclined surfaces that have a surface orientation of (111) and are inclined such that the inner diameter of the second nozzle portion 25 decreases toward the first nozzle portion 24.

A flow path protection film 130 is provided on the surfaces of the first nozzle forming substrate 22 and the second nozzle forming substrate 23 including the inner wall surfaces of the nozzle 21, which are some portions of the ink flow path, as illustrated in FIG. 3. In the embodiment, the flow path protection film 130 covers not only the surfaces of the first nozzle forming substrate 22 and the second nozzle forming substrate 23, but also substantially the entire surface of the ink flow path including the nozzle 21. This can suppress the single-crystal silicon substrates, which constitute the flow path member 200, such as the nozzle plate 20, from being dissolved by the ink. It should be noted that the flow path protection film 130 is not illustrated in the drawings other than FIG. 3.

This flow path protection film 130 is formed of, for example, a single layer of a single material or a composite material that has liquid resistance or of laminated films in which a plurality of materials having liquid resistance are laminated. Herein, "liquid resistance" refers to the etching resistance to the ink, which is a basic or acidic liquid. The material having liquid resistance used for the flow path protection film 130 includes an oxide or a nitride of one element selected from tantalum (Ta), titanium (Ti), zirconium (Zr), niobium (Nb), vanadium (V), hafnium (Hf), silicon (Si), aluminum (Al), tungsten (W), and yttrium (Y). That is, the flow path protection film 130 may be a single layer of a single material or a composite material containing an oxide or a nitride of the element described above or laminated films in which a plurality of materials are laminated. The material of the flow path protection film 130 is not limited to these materials and may be any material that can suppress the flow path member 200 including the nozzle plate 20 from being dissolved by the ink.

In addition, the method of forming the flow path protection film 130 is not particularly limited and, for example, an atomic layer deposition (ALD) method can be used. According to the atomic layer deposition method, the flow path protection film 130 with a high film density can be formed in a closely packed state, and the deposition property with respect to an object, such as the nozzle plate 20, becomes excellent.

In addition, in the embodiment, the first nozzle forming substrate 22 and the second nozzle forming substrate 23 that constitute the nozzle plate 20 are joined to each other via an adhesive, but the structure of the nozzle plate 20 is not limited to this. The nozzle plate 20 may be formed of, for example, an SOI substrate, and the first nozzle forming substrate 22 and the second nozzle forming substrate 23 may be formed as an integral component.

A compliance substrate 45 as well as the nozzle plate 20 is provided on the surface on the side opposite to the flow path forming substrate 10 across the communication plate 15, that is, on the surface on the +Z direction side. This compliance substrate 45 is provided around the nozzle plate 20 and seals the openings of the first manifold portions 17 and the second manifold portions 18 provided in the communication plate 15. In the embodiment, the compliance substrate 45 includes a sealing film 46 formed of a flexible thin film and a fixed substrate 47 formed of a hard material, such as metal. Fixed substrate 47 regions facing the manifolds 100 are openings 48 that completely pass through in the thickness direction. Therefore, one surfaces of the manifolds 100 are compliance portions 49 sealed only with flexible sealing films 46.

In contrast, piezoelectric actuators 300 as pressure generating elements are provided via a diaphragm 50 on the surface on the side opposite to the nozzle plate 20 across the flow path forming substrate 10, that is, on the surface on the −Z direction side. The piezoelectric actuators 300 are provided to correspond to the pressure chambers 12.

The recording head 1 ejects the ink through the nozzle 21 by driving the piezoelectric actuator 300 to bend and deform the diaphragm 50 to thereby cause a pressure change in the ink in the pressure chamber 12. It should be noted that the structures of the diaphragm 50 and the piezoelectric actuator 300 are not particularly limited and known structures may be adopted. Accordingly, such structures will not be described.

A protection substrate 30 having substantially the same size as the flow path forming substrate 10 is further joined onto the surface on the −Z direction side of the flow path forming substrate 10 with an adhesive or the like. A holding portion 31 that holds the plurality of piezoelectric actuators 300 is formed at the protection substrate 30. In addition, the protection substrate 30 is provided with a through-hole 32 passing through a portion between columns of the holding portion 31 in the Z-axis direction.

A case member 40 that, together with the flow path forming substrate 10, defines the manifolds 100 in communication with the plurality of the pressure chambers 12 is fixed onto the protection substrate 30. The case member 40 has substantially the same shape as the communication plate 15 as described above in plan view, and the case member 40 is joined to the protection substrate 30 and also joined to the communication plate 15 as described above.

The case member 40 is provided with a housing portion 41 that is a recess having a depth suitable for accommodating the flow path forming substrate 10 and having an opening that opens toward the protection substrate 30. The housing portion 41 has an open area that is larger than the area of the surface joined to the flow path forming substrate 10 of the protection substrate 30. Then, with the flow path forming substrate 10 and the protection substrate 30 accommodated in the housing portion 41, the opening surface of the housing portion 41 close to the nozzle plate 20 is sealed by the communication plate 15.

In the case member 40, third manifold portions 42 are formed at both outer sides in the X-axis direction of the housing portion 41. The first manifold portions 17 and the second manifold portions 18 provided in the communication plate 15 and the third manifold portion 42 constitute the manifolds 100 according to the embodiment.

The manifold 100 is provided for each column of the pressure chamber 12, and the manifolds 100 are continuously provided in the Y-axis direction. The supply communication paths 19 through which the pressure chambers 12 are in communication with the manifolds 100 are disposed in parallel in the Y-axis direction. Furthermore, the case member 40 is provided with introduction ports 43 that are in communication with the manifolds 100 to supply the ink to the manifolds 100.

As described above, the third manifold portions 42 and the introduction ports 43 that constitute the ink flow path are formed in the case member 40. That is, the flow path member 200 according to the embodiment includes the case member 40 in addition to the flow path forming substrate 10, the communication plate 15, and the nozzle plate 20 described above.

Furthermore, the case member 40 has a connection opening 44 that are in communication with the through-hole 32 of the protection substrate 30. Lead electrodes 90 are drawn from the piezoelectric actuators 300 into the through-hole 32, and a wiring substrate 120 inserted through the connection opening 44 is coupled to the lead electrodes 90. Driving circuits and the like that have switching elements for driving the piezoelectric actuators 300 are mounted on the wiring substrate 120.

It should be noted that the material of the case member 40 is not particularly limited and may be, for example, resin, metal, or the like. In addition, the material of the protection substrate 30 is not particularly limited, and a material having a linear expansion coefficient similar to that of the flow path forming substrate 10 to which the protection substrate 30 is fixed, such as a single-crystal silicon substrate, may be used.

The recording head 1 according to the embodiment as described above takes in ink through the introduction ports 43 coupled to an external ink supply unit, which is not illustrated, and the interior from the manifolds 100 to the nozzles 21 is filled with the ink. Then, the piezoelectric actuators 300 and the diaphragm 50 are bent and deformed by applying voltages to the piezoelectric actuators 300 corresponding to the pressure chambers 12 in accordance with a recording signal from the driving circuit, the pressure in the pressure chambers 12 increases, and ink drops are ejected from the nozzles 21.

As described above, the nozzle plate 20 according to the embodiment includes the first nozzle forming substrate 22 and the second nozzle forming substrate 23 including single-crystal silicon substrates having a surface orientation of {100}. In addition, the first nozzle forming substrate 22 and the second nozzle forming substrate 23 are joined to each other such that the cleavage directions thereof, which are the directions in which the cleavage surfaces develop, intersect each other in plan view. In other words, the first nozzle forming substrate 22 and the second nozzle forming substrate 23 are joined to each other such that the cleavage directions thereof in which the cleavage surfaces develop are not aligned with each other in plan view.

As described above, in the embodiment, the first nozzle forming substrate 22 and the second nozzle forming substrate 23 of the flow path member 200, which are provided on the side of the pressure chamber 12 across the diaphragm 50, are joined to each other such that the cleavage directions of both substrates are not aligned with each other; that is, the cleavage directions are not the same. Furthermore, the cleavage directions differ from each other between the first nozzle forming substrate 22 that forms the nozzle plate 20 disposed facing the ejection target medium, such as the printing sheet, and the second nozzle forming substrate 23 joined to this first nozzle forming substrate 22 of the flow path member 200.

Here, in a single-crystal silicon substrate having a surface orientation of {100}, the cleavage surface is the {110} plane orthogonal to the {100} plane of the surface. That is, the cleavage surface develops along the {100} plane orthogonal to the surface. In addition, the single-crystal silicon substrate having a surface orientation of {100} has two {110} planes orthogonal to the surface, and these two {110} planes intersect each other at an angle of approximately 90° in plan view. That is, the single-crystal silicon substrate having a surface orientation of {100} has two cleavage directions in which the cleavage surface develops, and these cleavage directions intersect each other at an angle of approximately 90° in plan view.

Therefore, the first nozzle forming substrate 22 and the second nozzle forming substrate 23 including single-crystal silicon substrates having a surface orientation of {100} are joined to each other such that the two cleavage directions of both substrates are not aligned with each other.

The method of forming the nozzle plate 20 by joining the first nozzle forming substrate 22 and the second nozzle forming substrate 23 such that the cleavage directions of both substrates intersect each other is not particularly limited and, for example, the following method may be used.

A plurality of first nozzle forming substrates 22 and second nozzle forming substrates 23 are integrally formed at one silicon wafer, and a notch portion indicating a predetermined crystal orientation is formed in this silicon wafer. The first nozzle forming substrate 22 and the second nozzle forming substrate 23 are positioned in accordance with this notch portion and are joined to each other such that the cleavage directions of both substrates intersect each other.

Specifically, as illustrated in FIG. 4, a notch portion 221 is formed in a first silicon wafer 220 in which the first nozzle forming substrate 22 is formed. This notch portion 221 is provided in the circumferential edge portion in the <110> direction of the first silicon wafer 220. Accordingly, one cleavage direction D1 of the first silicon wafer 220 is orthogonal to the direction toward the notch portion 221 from the center of the first silicon wafer 220, and the other cleavage direction D2 is the direction toward the notch portion 221.

In addition, as illustrated in FIG. 5, a notch portion 231 is also formed in the circumferential edge portion in the <110> direction of the second silicon wafer 230 in which the second nozzle forming substrate 23 is formed, as in the first silicon wafer 220. Accordingly, one cleavage direction D3 of the second silicon wafer 230 is orthogonal to the direction toward the notch portion 231 from the center of the first silicon wafer 220, and the other cleavage direction D4 is the direction toward the notch portion 231.

Next, when the nozzle plate 20 is formed, as illustrated in FIG. 6, the first silicon wafer 220 and the second silicon wafer 230 are first disposed such that the notch portion 221 and the notch portion 231 overlap each other in plan view. In this state, the cleavage direction D1 of the first silicon wafer 220 is aligned with the cleavage direction D3 of the second silicon wafer 230 in plan view, and the cleavage direction D2 of the first silicon wafer 220 is aligned with the cleavage direction D4 of the second silicon wafer 230 in plan view.

From this state, the first silicon wafer 220 and the second silicon wafer 230 are rotated relative to each other in the in-plane direction until the notch portion 221 does not overlap the notch portion 231 in plan view. For example, the second silicon wafer 230 is rotated relative to the first silicon wafer 220 such that the notch portion 221 does not overlap the notch portion 231 in plan view.

Specifically, as illustrated in FIG. 7, the second silicon wafer 230 is rotated such that the intersection angle between the center line passing through the notch portion 221 and the center line passing through the notch portion 231 in plan view, that is, an intersection angle θ1 between the cleavage direction D2 of the first silicon wafer 220 and the cleavage direction D4 of the second silicon wafer 230, becomes a predetermined angle.

As described above, in the first silicon wafer 220, the cleavage directions D1 and D2 intersect each other at an angle of approximately 90°. In the second silicon wafer 230, the cleavage directions D3 and D4 intersect each other at an angle of approximately 90°. Accordingly, when the intersection angle θ1 is not a multiple of 90°, the cleavage directions D1 and D2 of the first silicon wafer 220 are not aligned with each other in plan view and the cleavage directions D3 and D4 of the second silicon wafer 230 are not aligned with each other in plan view.

However, the intersection angle θ1 may be from 10° to 80°. In the embodiment, the intersection angle θ1 may be approximately half the intersection angle between the cleavage direction D1 and the cleavage direction D2 of the first silicon wafer 220 and may be approximately 45°.

Next, in such a state in which the notch portion 221 and the notch portion 231 do not overlap each other, the first silicon wafer 220 and the second silicon wafer 230 are joined to each other. This causes the first silicon wafer 220 and the second silicon wafer 230 to be joined to each other such that the cleavage directions thereof intersect each other in plan view.

After the first silicon wafer 220 and the second silicon wafer 230 are joined to each other, a plurality of nozzles 21 are formed in the first silicon wafer 220 and the second silicon wafer 230. For example, the plurality of first nozzle portions 24 are formed in a predetermined direction by dry-etching the first silicon wafer 220. In addition, the second nozzle portions 25 are formed in the positions corresponding to the first nozzle portions 24 by anisotropically wet-etching the second silicon wafer 230. This forms the plurality of nozzles 21 including the first nozzle portions 24 and the second nozzle portions 25.

Next, the first silicon wafer 220 and the second silicon wafer 230 are divided into chips of a predetermined size. This forms the plurality of nozzle plates 20 including the first nozzle forming substrate 22 and the second nozzle forming substrate 23 joined to each other such that the cleavage directions of both substrates intersect each other.

In addition, when the first nozzle forming substrate 22 and the second nozzle forming substrate 23 are joined to each other such that the cleavage directions of both substrates are not aligned with each other, the relationship between the cleavage directions D1 and D2 and the parallel arrangement direction of the first nozzle portions 24 in the first nozzle forming substrate 22 naturally differs from the relationship between the cleavage directions D3 and D4 and the parallel arrangement direction of the second nozzle portions 25 in the second nozzle forming substrate 23.

For example, when the plurality of first nozzle portions 24 are arranged in parallel in the cleavage direction D2 in the first nozzle forming substrate 22 as illustrated in FIG. 8, the plurality of second nozzle portions 25 are arranged in parallel in the direction D5, which is identical to the cleavage direction D2 and intersects the cleavage direction D4 at the intersection angle θ1 as illustrated in FIG. 9 in the second nozzle forming substrate 23, and the plurality of second nozzle portions 25 are not arranged in parallel in the cleavage direction D4.

The method of forming the nozzle plate 20 is not limited to the method described above. For example, the order of forming the first nozzle portions 24 and the second nozzle portions 25 by etching is not particularly limited and may be determined as appropriate.

In addition, in the embodiment, the first nozzle portions 24 and the second nozzle portions 25 are formed after the first silicon wafer 220 and the second silicon wafer 230 are joined to each other, but the first silicon wafer 220 and the second silicon wafer 230 may be joined to each other after the first nozzle portions 24 are formed in the first silicon wafer 220 and the second nozzle portions 25 are formed in the second silicon wafer 230.

In this case, the first nozzle portions 24 are arranged in parallel in a predetermined direction with respect to the cleavage directions D1 and D2 of the first silicon wafer 220, and the second nozzle portions 25 are arranged in parallel in a predetermined direction with respect to the cleavage directions D3 and D4 of the second silicon wafer 230. At that time, the relationship between the cleavage directions D1 and D2 of the first silicon wafer 220 and the parallel arrangement direction of the first nozzle portions 24 should not coincide with the relationship between the cleavage directions D3 and D4 of the second silicon wafer 230 and the parallel arrangement direction of the second nozzle portions 25.

Therefore, the first nozzle forming substrate 22 and the second nozzle forming substrate 23 are joined to each other such that the cleavage directions of both substrates intersect each other by joining the first silicon wafer 220 in which the first nozzle portions 24 are formed and the second silicon wafer 230 in which the second nozzle portions 25 are formed to each other to form the nozzle plate 20.

As described above, according to an aspect of the present disclosure, there is provided a MEMS device including the first substrate including a single-crystal silicon substrate and the second substrate including a single-crystal silicon substrate, the first substrate and the second substrate being laminated together, in which the first substrate and the second substrate are joined to each other such that the cleavage directions of both substrates intersect each other.

More specifically, there is provided a liquid ejecting head including a flow path member in which a liquid flow path including a pressure chamber is formed and a pressure generating element provided on one side of the pressure chamber, the pressure generating element causing a pressure change in the pressure chamber via a diaphragm, the liquid ejecting head ejecting a liquid from a nozzle in communication with the pressure chamber to an ejection target medium, in which the liquid ejecting head includes, as part of the flow path member, a first substrate including a single-crystal silicon substrate and a second substrate including a single-crystal silicon substrate, the first substrate and the second substrate are provided on a side of the pressure chamber across the diaphragm, and the first substrate and the second substrate are joined to each other such that a cleavage direction of the first substrate intersects a cleavage direction of the second substrate.

In the embodiment, the nozzle plate 20, which is a part of the flow path member 200, has the first nozzle forming substrate 22, which is the first substrate, and the second nozzle forming substrate 23, which is the second substrate, and the first nozzle forming substrate 22 and the second nozzle forming substrate 23 are joined to each other such that the cleavage directions both substrates intersect each other.

This can suppress cracks in the nozzle plate 20 from occurring in the cleavage direction. In addition, since the direction of thermal expansion of the first nozzle forming substrate 22 differs from the direction of thermal expansion of the second nozzle forming substrate 23, cracks in the nozzle plate 20 due to thermal expansion can also be suppressed from occurring. That is, the strength of the nozzle plate 20 can be increased, and the strength of the flow path member 200 including the nozzle plate 20 can be increased ultimately.

In addition, the first nozzle forming substrate 22, which is the first substrate, and the second nozzle forming substrate 23, which is the second substrate, may include single-crystal silicon substrates having a single surface orientation. This can reduce the cost of the recording head 1.

In addition, the first nozzle forming substrate 22, which is the first substrate, and the second nozzle forming substrate 23, which is the second substrate, may include single-crystal silicon substrates having a surface orientation of {100}, and the intersection angle between the cleavage direction of the first nozzle forming substrate 22, which is the first substrate, and the cleavage direction of the second nozzle forming substrate 23, which is the second substrate, may be from 10° to 80°. This can further increase the strength of the nozzle plate 20.

In addition, the first nozzle forming substrate 22, which is the first substrate, and the second nozzle forming substrate 23, which is the second substrate, may be formed of SOI substrates. Even in such a structure, the strength of the nozzle plate 20 can be increased because the cleavage directions of both substrates differ from each other.

In addition, the first substrate or the second substrate may be disposed to face the ejection target medium. In the embodiment, the first nozzle forming substrate 22, which is the first substrate, is disposed to face the ejection target medium, such as a printing sheet. In addition, the first nozzle forming substrate 22 and the second nozzle forming substrate 23 are joined to each other such that the cleavage directions both substrates intersect each other in plan view. This can suppress cracks in the nozzle plate 20 from occurring when, for example, the ejection target medium makes contact with the nozzle plate 20.

In addition, the first substrate and the second substrate may constitute the nozzle plate in which the nozzles for ejecting liquid are formed, and at least one of the first substrate and the second substrate that is disposed on the side opposite to the liquid ejected surface may include a single-crystal silicon substrate having a surface orientation of {100}. Specifically, at least the second nozzle forming substrate 23 that forms the nozzle plate 20 may include a single-crystal silicon substrate having a surface orientation of {100}. This enables the second nozzle portions 25 having inner surfaces formed by inclined surfaces to be formed by anisotropic wet etching and the channel resistance of the nozzle 21 to be increased.

In addition, the flow path protection film may be formed at the surfaces of the first substrate and the second substrate. For example, the flow path protection film 130 may formed at the surfaces of the first nozzle forming substrate 22, which is the first substrate, and the second nozzle forming substrate 23, that is, on the inner surfaces of the nozzles 21, which are some portions of the liquid flow path. This can suppress the nozzle plate 20 from being dissolved by the ink. In addition, since the strength of the nozzle plate 20 is increased as described above, cracks in the flow path protection film 130 can be suppressed from occurring.

Second Embodiment

Figure 10:
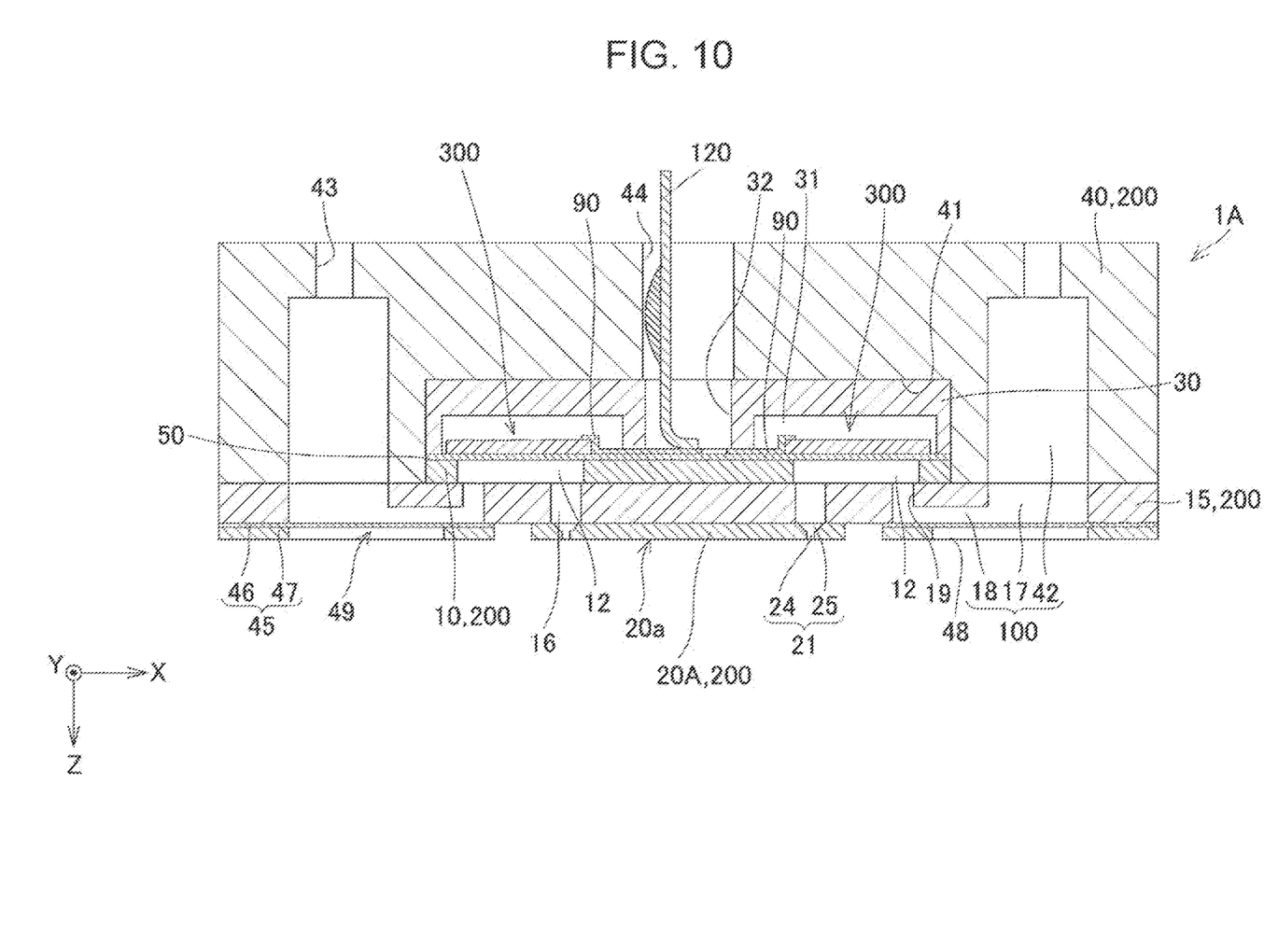
FIG. 10 is a sectional view of an ink jet recording head according to a second embodiment.

FIG. 10 is a sectional view of a recording head according to a second embodiment.

A recording head 1A according to the embodiment differs from the recording head 1 according to the first embodiment in that the recording head 1A has a nozzle plate 20A including one single-crystal silicon substrate having a surface orientation of {100}, as illustrated in FIG. 10.

In addition, in the embodiment, this nozzle plate 20A and the communication plate 15 including a single-crystal silicon substrate having a surface orientation of {110} are joined to each other such that the cleavage directions thereof intersect each other.

That is, in the embodiment, of the single-crystal silicon substrates constituting the flow path member 200, the cleavage directions differ from each other between the nozzle plate 20A, which corresponds to the first substrate, and the communication plate 15, corresponding to the second substrate, that is provided on the side opposite to the liquid ejected surface 20a across the nozzle plate 20A.

The same operation and effect as in the first embodiment can also be obtained by joining the nozzle plate 20A including a single-crystal silicon substrate having a surface orientation of {100} and the communication plate 15 including a single-crystal silicon substrate having a surface orientation of {110} to each other such that the cleavage directions of both substrates are not aligned with each other as described above. That is, the strengths of the nozzle plate 20A and the communication plate 15 can be increased, and the strength of the flow path member 200 including the nozzle plate 20A can be increased ultimately.

In addition, the method of joining the communication plate 15 and the nozzle plate 20A such that the cleavage directions of both plates intersect each other is not particularly limited. However, as in the first embodiment, the communication plate 15 and the nozzle plate 20A can be joined to each other such that the cleavage directions of both plates intersect each other by positioning the communication plate 15 and the nozzle plate 20A with reference to the notch portion of a silicon wafer.

Here, in the single-crystal silicon substrate having a surface orientation of {100} as described above, there are two cleavage directions in which the cleavage surfaces develop, and these cleavage directions intersect each other at an angle of approximately 90° in plan view. Accordingly, the intersection angle of the cleavage directions of the nozzle plate 20A is also approximately 90°.

In contrast, in the single-crystal silicon substrate having a surface orientation of {110}, the {111} plane orthogonal to the {110} plane of the surface can be a cleavage surface. The single-crystal silicon substrate having a surface orientation of {110} has two {111} planes orthogonal to the surface thereof, and these two {111} planes intersect each other at an angle of approximately 70.53°. That is, in the single-crystal silicon substrate having a surface orientation of {110}, there are two cleavage directions in which the cleavage surfaces develop, and these cleavage directions intersect each other at an angle of approximately 70.53° in plan view. Accordingly, the intersection angle of the cleavage directions of the communication plate 15 is also approximately 70.53°.

Figure 11:
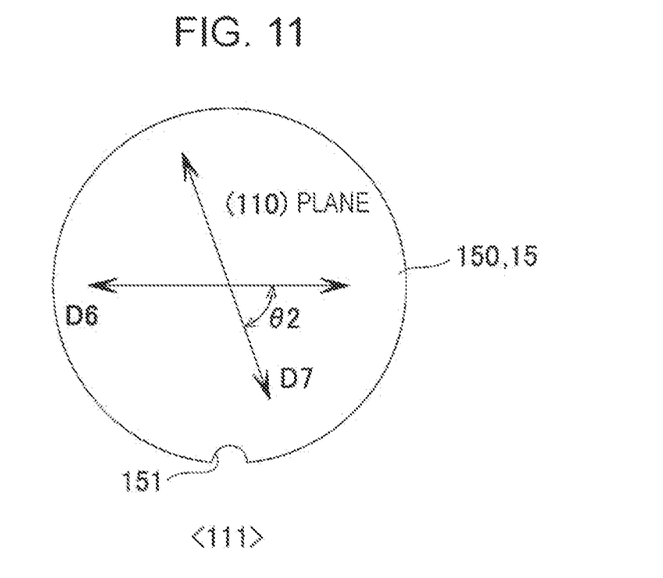
FIG. 11 is a diagram for describing the cleavage direction of a third silicon wafer.

For example, as illustrated in FIG. 11, a notch portion 151 is formed in a third silicon wafer 150 in which the communication plate 15 is formed. This notch portion 151 is provided in a part of the circumferential edge portion of the third silicon wafer 150 that is present in the <111> direction. Accordingly, one cleavage direction D6, which is one of the cleavage directions of the third silicon wafer 150, is orthogonal to the direction from the center of the third silicon wafer 150 to the notch portion 151, and a cleavage direction D7, which is the other of the cleavage directions, intersects the cleavage direction D6 at an angle of approximately 70.53°. That is, an intersection angle θ2 between the cleavage direction D6 and the cleavage direction D7 is approximately 70.53°.

When the communication plate 15 and the nozzle plate 20A are joined to each other, the rotation angle at which the silicon wafer is rotated may be approximately half the smallest angle among the intersection angles of the cleavage directions of the communication plate 15 and the nozzle plate 20A. In the embodiment, since the smallest angle, which is the intersection angle θ2 of the cleavage directions D6 and D7 of the communication plate 15, is 70.53°, the rotation angle may be approximately 35.26°, which is half the intersection angle θ2.

Therefore, the communication plate 15 and the nozzle plate 20A can be joined to each other such that the cleavage directions of both plates intersect at an appropriate intersection angle.

As described above, in the structure of the embodiment as well, the nozzle plate 20A and the communication plate 15, which constitute a part of the flow path member 200, include single-crystal silicon substrates and are joined to each other such that the cleavage directions of both plates intersect each other, as in the first embodiment.

This can suppress cracks in the nozzle plate 20A and the communication plate 15 from occurring in the cleavage direction. In addition, since the direction of thermal expansion of the nozzle plate 20A differs from that of the communication plate 15, cracks in the nozzle plate 20A and the communication plate 15 due to thermal expansion can also be suppressed from occurring. That is, the strengths of the nozzle plate 20A and the communication plate 15 can be increased, and the strength of the flow path member 200 including the nozzle plate 20A and the communication plate 15 can be increased ultimately.

In the embodiment, the nozzle plate 20A is formed of a single-crystal silicon substrate having a surface orientation of {100}, but the nozzle plate 20A may be formed of a single-crystal silicon substrate having a surface orientation of {110}.

That is, the nozzle plate 20A and the communication plate 15, which constitute some portions of the flow path member 200, include single-crystal silicon substrates having a surface orientation of {110} and the nozzle plate 20A and the communication plate 15 may be joined to each other such that the cleavage directions of both plates intersect each other. In this case, the first nozzle portions 24 and the second nozzle portions 25 that constitute the nozzle 21 may be formed by, for example, dry etching.

In this structure, the single-crystal substrates having a surface orientation of {110} are joined to each other such that the cleavage directions of both substrates intersect each other. Accordingly, since the smallest angle among the intersection angles of the cleavage directions of the communication plate 15 and the nozzle plate 20A to be joined is approximately 70.53°, the angle at which the silicon wafer is rotated to join the communication plate 15 and the nozzle plate 20A to each other may be half this angle, that is, approximately 35.26°.

Even in such a structure, the strengths of the nozzle plate 20A and the communication plate 15 can be increased as described above, and the strength of the flow path member 200 including the nozzle plate 20A and the communication plate 15 can be increased ultimately.

In addition, the nozzle plate 20A, which is the first substrate, may include a single-crystal silicon substrate having a first surface orientation and the communication plate 15, which is the second substrate, may include a single-crystal silicon substrate having a second surface orientation that differs from the first surface orientation. More specifically, one of the nozzle plate 20A, which is the first substrate, and the communication plate 15, which is the second substrate, may include a single-crystal silicon substrate having a surface orientation of {100} and the other of these plates may include a single-crystal silicon substrate having a surface orientation of {110}. In the embodiment, the nozzle plate 20A, which is the first substrate, includes a single-crystal silicon substrate having a surface orientation of {100}, and the communication plate 15, which is the second substrate and provided on the side opposite to the liquid ejected surface across the nozzle plate, includes a single-crystal silicon substrate having a surface orientation of {110}.

This can easily form the substrates constituting the flow path member 200, such as the nozzle plate 20A and the communication plate 15, in desired shapes by anisotropic wet etching.

Third Embodiment

Figure 12:
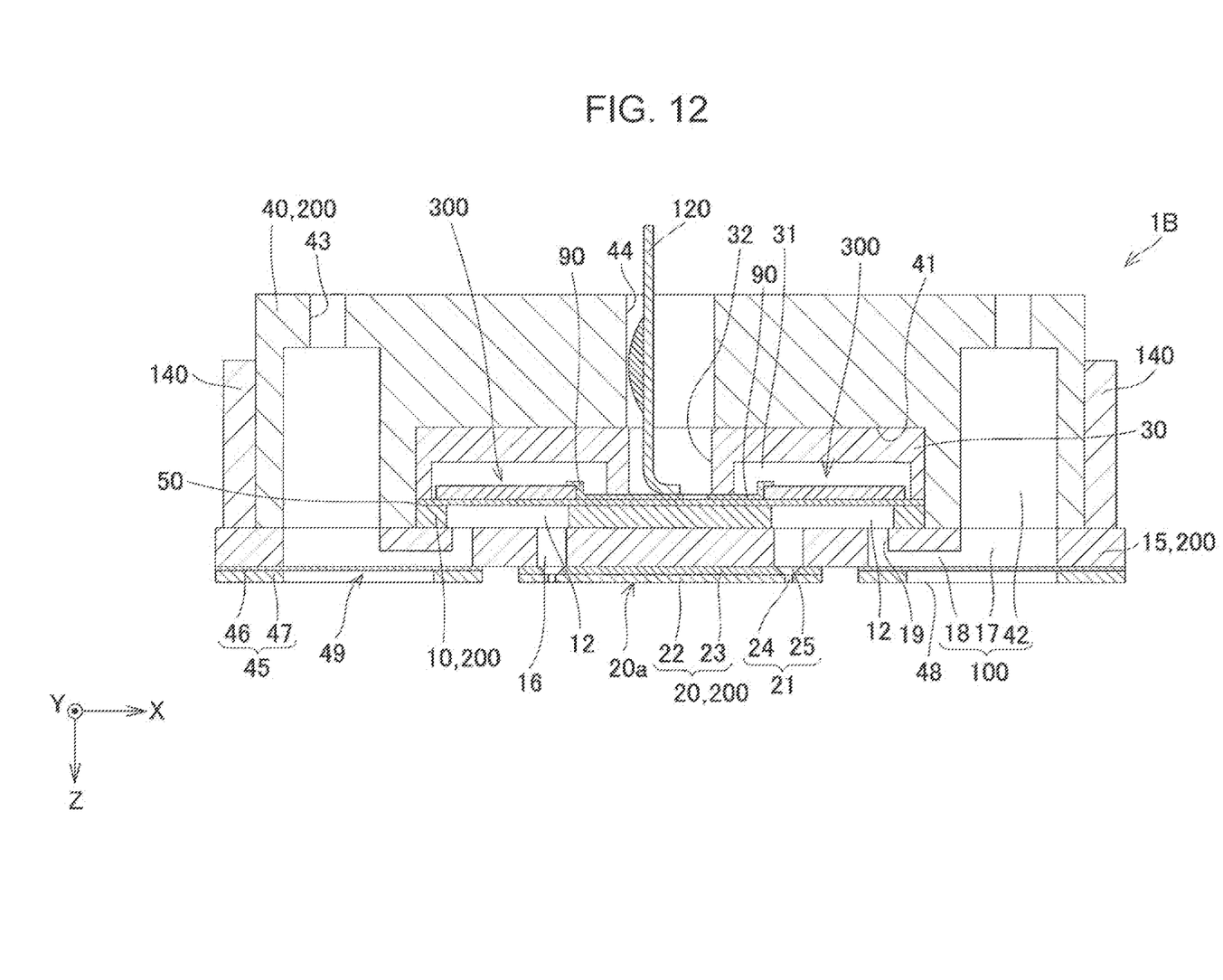
FIG. 12 is a sectional view of an ink jet recording head according to a third embodiment.

FIG. 12 is a sectional view of a recording head according to a third embodiment.

As illustrated in FIG. 12, a recording head 1B according to the embodiment is the same as the recording head 1 according to the first embodiment except that the recording head 1B has heaters 140 that are heating units for heating the ink circulating through the flow path member 200. The heaters 140 are provided to correspond to the manifolds and are fixed to the case member 40 to heat the ink within the manifolds 100. The structure of the heaters 140 is not particularly limited and, for example, a film heater or the like may be used.

In the recording head 1B according to the embodiment, when, for example, an ultraviolet curing ink or a solvent ink is used as the ink, the heaters 140 heat the ink to reduce the viscosity thereof.

At this time, a temperature change, for example, a temperature rise in the flow path member 200 that constitutes the recording head 1B may cause warping of the substrates, such as the nozzle plate 20, that constitute the flow path member 200 and cause cracks in the cleavage direction. In the embodiment as well, however, the first nozzle forming substrate 22 and the second nozzle forming substrate 23 that constitute the nozzle plate 20 are joined to each other such that the cleavage directions of both substrates intersect each other, so the strength of the nozzle plate 20 is increased and the occurrence of cracks in the nozzle plate 20 due to temperature changes can be suppressed. In addition, it is possible to suppress the occurrence of cracks in the substrates constituting the flow path member 200 including the nozzle plate 20.

As described above, the recording head 1B according to the present embodiment has the heaters 140 for heating the liquid circulating through the flow path member 200. Even in the recording head 1B having the heaters 140 as described above, since the first nozzle forming substrate 22 and the second nozzle forming substrate 23 are joined to each other such that the cleavage directions of both substrates intersect each other, cracks in the nozzle plate 20 can be suppressed from occurring as in the embodiments described above.

Other Embodiments

Embodiments of the present disclosure have been described above, but the basic structure of the present disclosure is not limited to those described above.

For example, in the first embodiment described above, an example in which the first nozzle forming substrate 22 and the second nozzle forming substrate 23 that constitute the nozzle plate 20 are joined to each other such that the cleavage directions of the both substrates intersect each other has been described. In the second embodiment, an example in which the nozzle plate 20A and the communication plate 15 are joined to each other such that the cleavage directions of both plates intersect each other has been described. However, the substrates to be joined to each other such that the cleavage directions of both substrates intersect each other are not particularly limited. For example, the flow path forming substrate 10 and the communication plate 15 may be joined to each other such that the cleavage directions of both substrates intersect each other.

In addition, for example, the embodiments described above exemplifies the structure in which the flow path member 200 includes the flow path forming substrate 10, the communication plate 15, and the nozzle plate 20, but the structure of the flow path member 200 is not particularly limited. For example, the flow path member 200 does not need to have the communication plate 15, or the flow path member 200 may include a member including a single-crystal silicon substrate in addition to the flow path forming substrate 10, the communication plate 15, and the nozzle plate 20.

Figure 13:
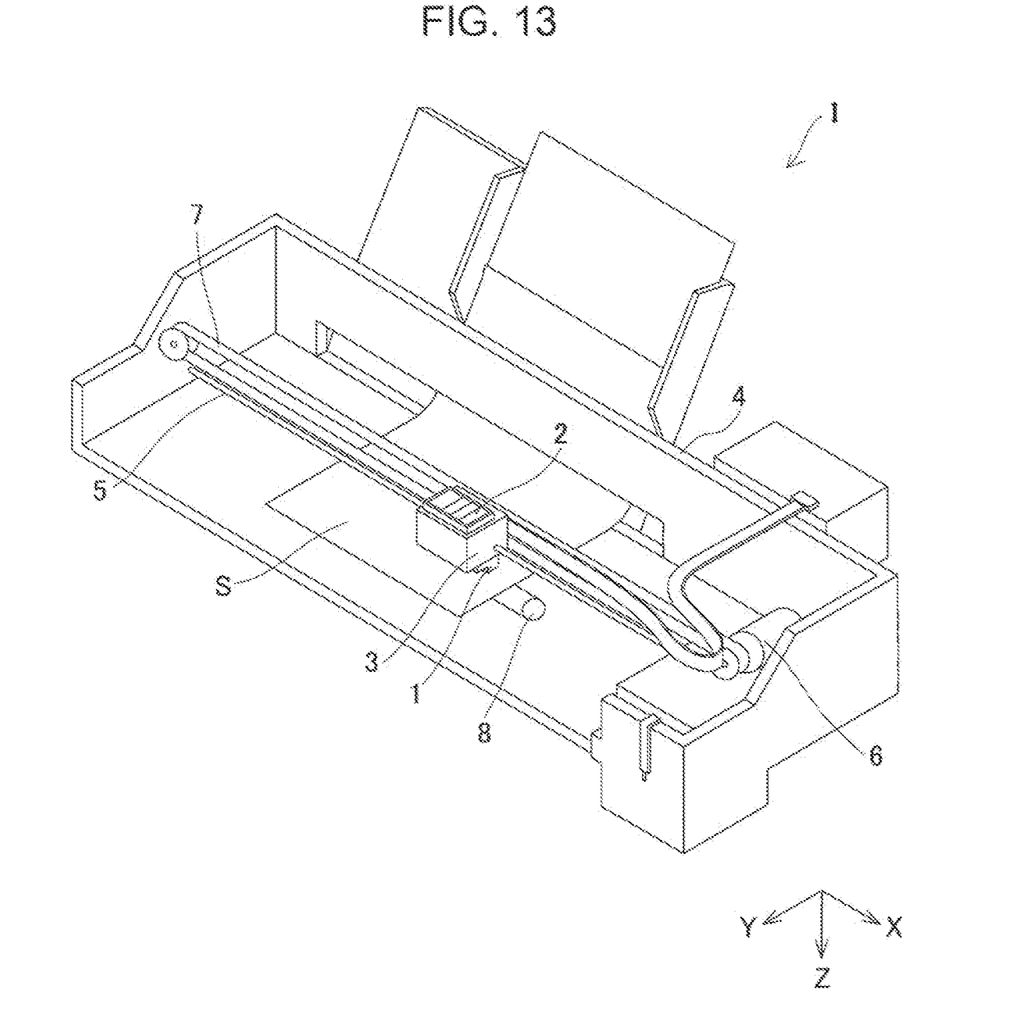
FIG. 13 is a diagram illustrating a schematic structure of a recording apparatus according to one embodiment.

In addition, the recording head 1 according to the embodiments is installed in an ink jet recording apparatus, which is an example of the liquid ejecting apparatus. FIG. 13 is a schematic diagram illustrating an example of the ink jet recording apparatus, which is an example of the liquid ejecting apparatus according to one embodiment.

In an ink jet recording apparatus I illustrated in FIG. 13, a cartridge 2 constituting an ink supply unit is provided in the recording head 1 in a detachable manner and is mounted in a carriage 3. The carriage 3 having this recording head 1 is attached provided movably in the axial direction of a carriage shaft 5 attached to an apparatus main body 4.

In addition, the driving force of a drive motor 6 is transmitted to the carriage 3 via a plurality of gears, which are not illustrated, and a timing belt 7, and the carriage 3 having the recording head 1 moves along the carriage shaft 5. On the other hand, the apparatus main body 4 has a transport roller 8 as a transport unit, and the transport roller 8 transports a recording sheet S, which is a recording medium, such as paper. It should be noted that the transport unit for transporting the recording sheet S is not limited to the transport roller 8 and may be a belt, a drum, or the like.

The ink jet recording apparatus I as described above performs attachment of ink droplets, that is, printing over substantially the entire surface of the recording sheet S by ejecting ink droplets from the recording head 1 while transporting the recording sheet S in the +Y direction with respect to the recording head 1 and reciprocating the carriage 3 in the X direction with respect to the recording sheet S.

In the ink jet recording apparatus I described above, the carriage 3 having the recording head 1 reciprocates in the X direction, which is the main scanning direction, but the structure of the ink jet recording apparatus is not limited to this. The ink jet recording apparatus may be a so-called line-type recording apparatus in which, for example, printing is performed by moving only the recording sheet S such as paper in the X direction, which is the sub-scanning direction, with the recording head 1 fixed. The present disclosure is also applicable to the ink jet recording apparatus having the structure as described above.

It should be noted that, in the embodiments described above, the ink jet recording head is used as an example of the liquid ejecting head and the ink jet recording apparatus is used as an example of the liquid ejecting apparatus. However, the present disclosure widely targets liquid ejecting heads and liquid ejecting apparatuses in general and is of course applicable to liquid ejecting heads and liquid ejecting apparatuses that eject liquids other than ink. Other liquid ejecting heads include various recording heads used for image recording apparatuses such as printers, color material ejection heads used to manufacture color filters such as liquid crystal displays, electrode material ejection heads used to form electrodes for organic EL displays, field emission displays (FEDs), or the like, bioorganic substance ejection heads used to manufacture biochips, and the like, and the present disclosure is applicable to liquid ejecting apparatuses having such liquid ejecting heads.

What is claimed is:

1. A MEMS device comprising:
a first substrate including a single-crystal silicon substrate; and
a second substrate including a single-crystal silicon substrate, the first substrate and the second substrate being laminated together, wherein
the first substrate and the second substrate are joined to each other such that a cleavage direction of the first substrate intersects a cleavage direction of the second substrate in a plan view; and
the cleavage directions of the first substrate and the second substrate are along cleavage surfaces of the single-crystal silicon substrates that are arranged orthogonal to a crystal plane of a surface of each of the first substrate and the second substrate in the plan view.

2. The MEMS device according to claim 1, wherein
the first substrate includes a single-crystal silicon substrate having a first surface orientation and the second substrate includes a single-crystal silicon substrate having a second surface orientation that is identical to the first surface orientation.

3. The MEMS device according to claim 2, wherein
the first substrate includes a single-crystal silicon substrate having a surface orientation of {100} and the second substrate includes a single-crystal silicon substrate having a surface orientation of {100}, and
an intersection angle at which the cleavage direction of the first substrate intersects the cleavage direction of the second substrate is from 10° to 80°.

4. The MEMS device according to claim 1, wherein
the first substrate includes a single-crystal silicon substrate having a first surface orientation and the second substrate includes a single-crystal silicon substrate having a second surface orientation that differs from the first surface orientation.

5. The MEMS device according to claim 4, wherein
one of the first substrate and the second substrate includes a single-crystal silicon substrate having a surface orientation of {100} and the other of the first substrate and the second substrate includes a single-crystal silicon substrate having a surface orientation of {110}.

6. The MEMS device according to claim 1, wherein
the first substrate and the second substrate are formed of SOI substrates.

7. A liquid ejecting head comprising:
the MEMS device according to claim 1;
a flow path member in which a liquid flow path including a pressure chamber is formed; and
a pressure generating element provided on one side of the pressure chamber, the pressure generating element causing a pressure change in the pressure chamber via a diaphragm, the liquid ejecting head ejecting a liquid from a nozzle in communication with the pressure chamber to an ejection target medium, wherein
the flow path member includes the first substrate of the MEMS device and the second substrate of the MEMS device, and
the first substrate and the second substrate are provided on a side of the pressure chamber across the diaphragm, and the first substrate and the second substrate are joined to each other such that a cleavage direction of the first substrate intersects a cleavage direction of the second substrate.

8. The liquid ejecting head according to claim 7,
wherein the first substrate or the second substrate is disposed to face the ejection target medium.

9. The liquid ejecting head according to claim 7, wherein
the first substrate and the second substrate constitute a nozzle plate in which a nozzle for ejecting the liquid is formed, and
at least one of the first substrate and the second substrate that is disposed on a side opposite to a liquid ejected surface includes a single-crystal silicon substrate having a surface orientation of {100}.

10. The liquid ejecting head according to claim 7, wherein
the first substrate is a nozzle plate in which the nozzle for ejecting the liquid is formed and includes a single-crystal silicon substrate having a surface orientation of {100}, and
the second substrate is provided on a side opposite to a liquid ejected surface across the nozzle plate and includes a single-crystal silicon substrate having a surface orientation of {110}.

11. The liquid ejecting head according to claim 7, wherein
a flow path protection film is formed at a surface of the first substrate and a surface of the second substrate.

12. The liquid ejecting head according to claim 7, further comprising:
a heater that heats a liquid circulating through the liquid flow path.

13. A liquid ejecting apparatus having the liquid ejecting head according to claim 7.

14. A MEMS device comprising:
a first substrate including a single-crystal silicon substrate; and
a second substrate including a single-crystal silicon substrate, the first substrate and the second substrate being laminated together, wherein
the first substrate and the second substrate are joined to each other such that a cleavage direction of the first substrate intersects a cleavage direction of the second substrate,
the first substrate includes a single-crystal silicon substrate having a first surface orientation and the second substrate includes a single-crystal silicon substrate having a second surface orientation that is identical to the first surface orientation
the first substrate includes a single-crystal silicon substrate having a surface orientation of {100} and the second substrate includes a single-crystal silicon substrate having a surface orientation of {100}, and
an intersection angle at which the cleavage direction of the first substrate intersects the cleavage direction of the second substrate is from 10° to 80°.

* * * * *